(12) United States Patent
Kuiper et al.

(10) Patent No.: US 10,712,674 B2
(45) Date of Patent: Jul. 14, 2020

(54) METHOD OF DETERMINING AN OVERLAY ERROR, MANUFACTURING METHOD AND SYSTEM FOR MANUFACTURING OF A MULTILAYER SEMICONDUCTOR DEVICE, AND SEMICONDUCTOR DEVICE MANUFACTURED THEREBY

(71) Applicant: Nederlandse Organisatie voor toegepast-natuurwetenschappelijk onderzoek TNO, s-Gravenhage (NL)

(72) Inventors: Stefan Kuiper, 's-Gravenhage (NL); Erwin John van Zwet, 's-Gravenhage (NL); Stefan Michael Bruno Bäumer, 's-Gravenhage (NL); Hamed Sadeghian Marnani, 's-Gravenhage (NL)

(73) Assignee: NEDERLANDSE ORGANISATIE VOOR TOEGEPAST-NATUURWETEN SCHAPPELUK ONDERZOEK TNO, S-Gravenhage (NL)

( * ) Notice: Subject to any disclaimer, the term of this patent is extended or adjusted under 35 U.S.C. 154(b) by 0 days.

(21) Appl. No.: 15/776,901

(22) PCT Filed: Nov. 17, 2016

(86) PCT No.: PCT/NL2016/050803
§ 371 (c)(1),
(2) Date: May 17, 2018

(87) PCT Pub. No.: WO2017/086787
PCT Pub. Date: May 26, 2017

(65) Prior Publication Data
US 2018/0329312 A1    Nov. 15, 2018

(30) Foreign Application Priority Data
Nov. 18, 2015   (EP) .................................. 15195083

(51) Int. Cl.
*G03F 7/20*   (2006.01)
*H01L 21/66*   (2006.01)

(52) U.S. Cl.
CPC ...... *G03F 7/70633* (2013.01); *G03F 7/70625* (2013.01); *G03F 7/70683* (2013.01); *H01L 22/12* (2013.01); *H01L 22/20* (2013.01)

(58) Field of Classification Search
CPC . G01B 11/14; G03F 7/70633; G03F 7/70625; G03F 7/70683; H01L 22/12; H01L 22/20
(Continued)

(56) References Cited

U.S. PATENT DOCUMENTS 5,298,975 A * 3/1994 Khoury .................. B82Y 35/00
356/624
9,007,571 B2 * 4/2015 Tzai ..................... G03F 7/70633
356/72

(Continued)

OTHER PUBLICATIONS

Schwantes et al., "Impact of Parasitic Elements on the Performance of Digital CMOS Circuits with Gigabit Feature Size", Solid-State Electronics, vol. 47, pp. 1243-1248; 2003.

*Primary Examiner* — Gordon J Stock, Jr.
(74) *Attorney, Agent, or Firm* — Hoffmann & Baron, LLP

(57) ABSTRACT

This document describes a method of determining an overlay error during manufacturing of a multilayer semiconductor device. Manufacturing of the semiconductor device comprises forming a stack of material layers comprising depositing of at least two subsequent patterned layers of semiconductor material, the patterned layers comprising a first patterned layer having a first marker element and a second patterned layer having a second marker element. The determining of the overlay error comprises determining relative positions of the first and second marker element in relation to each other, such as to determine the overlay error between the first patterned layer and the second patterned
(Continued)

layer. In addition an imaging step is performed on at least one of said first and second patterned layer, for determining relative positions of the respective first or second marker element and a pattern feature of a device pattern comprised by said respective first and second patterned layer.

16 Claims, 7 Drawing Sheets

(58) Field of Classification Search
USPC .................................................. 356/399–401
See application file for complete search history.

(56) References Cited

U.S. PATENT DOCUMENTS

| | | |
|---|---|---|
| 2003/0233870 A1 | 12/2003 | Mancevski |
| 2009/0063378 A1* | 3/2009 | Izikson ................ G05B 13/027 706/21 |
| 2010/0190096 A1 | 7/2010 | Ausschnitt et al. |
| 2014/0065736 A1* | 3/2014 | Amir ..................... H01L 23/544 438/14 |
| 2014/0316730 A1 | 10/2014 | Shchegrov et al. |
| 2018/0203369 A1* | 7/2018 | Stiepan ............... G03F 7/70625 |

* cited by examiner

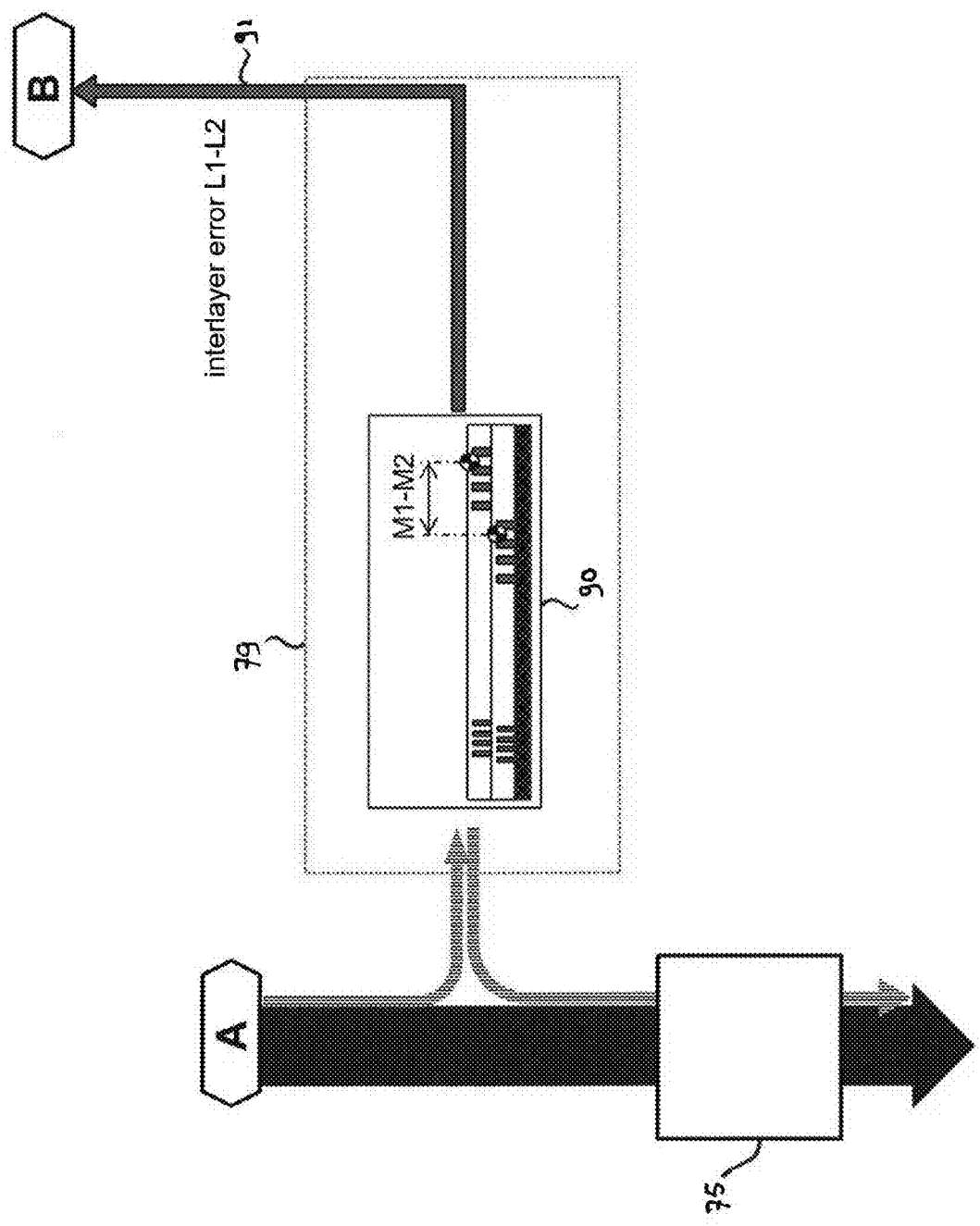

METHOD OF DETERMINING AN OVERLAY ERROR, MANUFACTURING METHOD AND SYSTEM FOR MANUFACTURING OF A MULTILAYER SEMICONDUCTOR DEVICE, AND SEMICONDUCTOR DEVICE MANUFACTURED THEREBY

FIELD OF THE INVENTION

The present invention is directed at a method of determining an overlay error during manufacturing of a multilayer semiconductor device, wherein said manufacturing of the semiconductor device comprises the steps of forming a stack of material layers comprising depositing of at least two subsequent patterned layers of semiconductor material, the patterned layers comprising a first patterned layer having a first marker element and a second patterned layer having a second marker element; and wherein the determining of the overlay error comprises determining relative positions of the first and second marker element in relation to each other such as to determine the overlay error between the first patterned layer and the second patterned layer. The invention is further directed at a manufacturing process for a semiconductor device comprising a method as described above, a system for manufacturing of a multilayer semiconductor device, and a semiconductor device manufactured using the method or system as described.

BACKGROUND

Developments in the semiconductor industry are typically governed by Moore's law which predicts that the number of transistors in a dense integrated circuit doubles every two years. As will be appreciated, this poses significant technological challenges whenever technological boundaries constituted by physical laws are encountered and need to be overcome to meet the industry demands for even smaller and smaller integrated circuits.

One typical challenge encountered already in the twentieth century, was the need to take into account interlayer misalignment between functional layers of a multilayer semiconductor device. In the multilayered structure of semiconductor devices, functional device layers are typically deposited on top of other functional device layers. The functional product features, i.e. the features of the pattern formed in each layer, need to be aligned accurately with those in contiguous functional layers to enable correct operation of the end product: the semiconductor device. This is achieved by monitoring an overlay error during manufacturing, i.e. the amount of misalignment between subsequent layers, by determining relative positions between marker elements in subsequent layers. This improvement, and the advancements achieved after this in the determination of overlay errors, has allowed to continue making semiconductor elements smaller and smaller over the past decennia, in accordance with Moore's law. The present state of the technology that is applied for measuring overlay error, is the use of diffraction optics to determine a relative distance between marker elements.

A disadvantage of the current determination methods for determining overlay error, is that the marker features that can be 'seen' using the diffraction optical methods applied are of much larger dimensions than the functional product features, i.e. pattern features, nowadays desired in accordance with Moore's law. Therefore, even though the correct alignment of marker elements in subsequent layers of a multilayer semiconductor device can be established by monitoring the overlay error with existing techniques, it can still not be guaranteed that also the much smaller pattern features in subsequent layers are correctly aligned. These small pattern features are differently affected by sensing errors, e.g. lens errors, of the alignment sensor used for determining the overlay error. Hence, an undesired or destructive overlay error is more and more difficult to rule out during manufacturing.

SUMMARY OF THE INVENTION

It is an object of the present invention to provide a method of determining an overlay error that can be applied during manufacturing of a multilayer semiconductor device, and which overcomes the disadvantages described above, allowing correct determination of overlay errors for even the smallest pattern features desired to be manufactured.

To this end, there is provided herewith a method of determining an overlay error during manufacturing of a multilayer semiconductor device, wherein said manufacturing of the semiconductor device comprises the steps of: forming a stack of material layers comprising depositing of at least two subsequent patterned layers of semiconductor material, the patterned layers comprising a first patterned layer having a first marker element and a second patterned layer having a second marker element; and wherein the determining of the overlay error comprises: determining relative positions of the first and second marker element in relation to each other such as to determine the overlay error between the first patterned layer and the second patterned layer; wherein for determining the overlay error, in addition to said step of determining said relative positions of the first and second marker element, the method comprises a step of: performing an imaging step on at least one of said first and second patterned layer, for determining relative positions of the respective first or second marker element and a pattern feature of a device pattern comprised by said respective first and second patterned layer.

The present invention is based on the insight that an additional imaging step is required such as to enable correct determination of the relative positions of the pattern features in one layer, in addition to the determining of relative positions of the first and second marker element in relation to each other. The latter, the determining of the relative positions of the first and second marker elements, is performed across multiple layers to allow detection of both marker elements with one sensing step. This, however, cannot be performed with a sufficiently high resolution to allow correct detection of the much smaller pattern features across multiple layers. Therefore, the present invention applies an additional imaging step to determine the relative positions between one or more pattern features and the respective marker element within at least one of the first or second layer. To allow correct determination of the overlay error even at the scale of the pattern features, a combination is made between on one hand the regular interlayer imaging step for determining the overlay error between marker elements of subsequent layers, and on the other hand the additional imaging step that is performed within (at least) one layer. This allows to determine the overlay error with a very high accuracy both at the scale of dimension of the marker features (typically 40×80 micrometer (μm) in size, comprising a line pattern having a pitch of 1-3 μm) and at the scale of dimensions of the pattern features (i.e. product features; typically line patterns (e.g. unidirectional or bi-directional having a line pitch of e.g. 20 nanometer (nm), 10 nm or even smaller)).

It will be appreciated that various imaging techniques may be applied in any desired combination to enable the above determination of the overlay error. Various techniques are available for providing a sufficiently good imaging resolution to perform the interlayer imaging step for determining the relative positions of the marker features in both the first and second layer. For example, as referred to above, the interlayer imaging may be performed using a diffraction optics based sensing technique, applying a diffraction based alignment sensor. The additional imaging step performed within one layer, must be performed at an imaging resolution allowing accurate detection of the pattern features. This accuracy is more easily obtainable amongst other as a result of the fact that the imaging is only performed within one layer, which provides the flexibility to apply other imaging techniques with higher resolutions than for the interlayer imaging step.

It may be appreciated that improvements to the determination of the overlayer error may already be achieved by performing the additional in-layer imaging step on at least one of the first or second layer of the device. An assumption may then for example be made for the relative positions between pattern features and the marker feature in the second layer. Not having to perform the additional in-layer imaging step on all layers of the device will of course speed up the process of monitoring the overlay error at the cost of, may be, some accuracy.

However, to fully benefit from the additional in-layer imaging proposed by the present invention in terms of accuracy, in accordance with some embodiments, the imaging step is performed on both the first patterned layer and the second patterned layer. In these embodiments, the additional imaging step is performed on each of the first and second layer, in addition to the interlayer determination of relative positions of the marker features in both layers. This may, dependent on the application, be repeated for each two consecutive contiguous layers of a multilayer device, e.g. by performing the additional in-layer imaging step for any third, fourth, fifth and any possible further layer of the device. The interlayer imaging step for determining the relative position of marker elements between layers, may in that case be performed additionally for the second and third layer, for the third and fourth layer, for the fourth and fifth layer, and so on.

In principle, imaging techniques such as scanning electron microscopy or scanning transmission ion microscopy will provide the desired resolution to detect and image the pattern features. Hence, these imaging techniques may be applied in embodiments of the present invention without departing from the scope of the claims. However, such techniques suffer from the disadvantages that they can only be performed in a small area near the marker element, and further that these imaging methods are destructive on the sample to be measured. In particular, to enable imaging a higher resolutions accurately, the energy density of an electron beam used for imaging must be likewise increased. The resulting damage caused by imaging will in turn increase with increasing energy density of the beam.

Therefore, in accordance with some embodiments, the additional in-layer imaging step is performed using scanning probe microscopy (SPM), such as an atomic force microscopy (AFM). An advantage of scanning probe microscopy methods over the imaging techniques described above, is that it can be performed across much larger areas. In principle, there is no limit to the area that can be imaged, thereby allowing the accurate determination of overlay errors during manufacturing of semiconductor devices of any size. In addition, many of the scanning probe microscopy methods, such as atomic force microscopy methods, are non-destructive imaging methods that allow high resolution imaging of pattern features without affecting their integrity.

In some of these embodiments, the scanning probe microscopy is performed using a sensor head including a probe with a cone shaped probe tip for scanning of a surface of the at least one first or second patterned layer, and the sensor head is arranged for tilting of the cone shaped probe tip such that an apex of the cone shaped probe tip forms a foremost point in a scanning direction during said scanning. By doing so, the SPM method can be performed on high aspect ratio features, i.e. features having walls at high angles (e.g. angles between $\Pi/4$ and $3\Pi/4$ radians, or between $\Pi/3$ and $2\Pi/3$ radians, or between $5\Pi/12$ and $7\Pi/12$ radians) with the surface of the layer to be scanned (i.e. in the scanning direction). Since the side walls of many pattern features are at straight angles with the surface of the layer, this tilting is particularly advantageous to obtain the desired accuracy and resolution, which may otherwise be limited by the oblique side walls of the probe tip.

In accordance with some of these embodiments of the method, the scanning is performed by moving the probe relative to the surface of the at least one first or second patterned layer in a first scanning direction, and subsequently moving the probe relative to the surface of the at least one first or second patterned layer in a second scanning direction, wherein said tilting of the cone shaped probe tip is adapted dependent on the scanning direction. The tilting may be adapted upon change of the scanning direction, e.g. such as to enable scanning back and forth while maintaining the accuracy in any direction of scanning.

In accordance with embodiments of the present invention, in the method, the step of determining the relative positions of the first and second marker element in relation to each other comprises an optical diffraction sensing step suitable for detecting both the first marker element in the first patterned layer and the second marker element in the second patterned layer. The optical diffraction sensing step for example is performed using a diffraction based alignment sensor. For example, the optical diffraction sensing step may be performed by projecting light onto the upper one of the first and second layer of the multilayer device, which light is diffracted by the marker elements in both layers. The diffracted light is received as an interference pattern that can be registered using a camera. Using the received interference pattern, the marker elements in the first and second layer can be imaged with a higher resolution than would be obtainable using standard high resolution cameras and optics. It may be appreciated that, where a lower resolution is sufficient, conventional optical sensing methods may alternatively applied without departing from the invention.

In accordance with some embodiments of the invention, the method further comprises a step of obtaining a reference map of the at least one of said first and second patterned layer to be imaged during the imaging step, and comparing an image of the respective one of the at least one of said first and second patterned layer obtained by means of said imaging step with said reference map for determining a positioning error. For example, the reference map may be the original design blue print of the pattern to be formed in the respective layer. Determining the positioning error in this manner enables detection and correction of alignment and positioning errors within one layer, and calibration of an apparatus or system that is used for depositing the respective layer. Hence, in accordance with some of these embodiments, the method further comprises a step of determining, based on the position error, manufacturing adjustments for adjusting said depositing of a respective first or second patterned layer of the at least two subsequent patterned layers of semiconductor material for correcting the position error.

In accordance with a second aspect of the invention, there is provided a manufacturing process for manufacturing a semiconductor device, the process comprising the steps of forming a stack of material layers by depositing of at least two subsequent patterned layers of semiconductor material, the patterned layers comprising a first patterned layer having a first marker element and a second patterned layer having a second marker element, wherein the manufacturing process further comprises a method of determining an overlay error in accordance with any of the claims 1-6, at least comprising the steps of: determining relative positions of the first and second marker element in relation to each other such as to determine the overlay error between the first patterned layer and the second patterned layer; wherein for determining the overlay error, in addition to said step of determining said relative positions of the first and second marker element, the method comprises a step of: performing an imaging step on at least one of said first and second patterned layer, for determining relative positions of the respective first or second marker element and a pattern feature of a device pattern comprised by said respective first and second patterned layer. Moreover, in some embodiments, the determined overlay error is corrected by additional steps of adjusting said deposition of the respective first or second patterned layer of the at least two subsequent patterned layers.

In accordance with a further aspect of the invention, there is provided a system for manufacturing of a multilayer semiconductor device, the system comprising one or more layer deposition arrangements for forming a stack of material layers by depositing of at least two subsequent patterned layers of semiconductor material, the patterned layers comprising a first patterned layer having a first marker element and a second patterned layer having a second marker element, wherein the system further comprises: a sensor arrangement for determining relative positions of the first and second marker element in relation to each other; and a processor for determining the overlay error between the first patterned layer and the second patterned layer based on the determined relative positions of the first and second marker element; and wherein the system further comprises: an imaging device for performing an imaging step on at least one of said first and second patterned layer, for determining relative positions of the respective first or second marker element and a pattern feature of a device pattern comprised by said respective first and second patterned layer.

In accordance with yet a further aspect of the invention, there is provided multilayer semiconductor device manufactured using a method according to any of the claim 9 or 10 or using a system according to any of the claims 11-14, wherein the semiconductor device comprises aligned functional pattern features having cross sectional dimensions in a range of 10 to 40 nanometer across a surface having a typical length or width dimension in a range of 1 to 30 millimeter. The multilayer semiconductor devices in accordance with this aspect can be manufactured using the method and system of the present invention, such that they have an overlay error of at most 2 nm across these typical length and width dimensions (or even≤1 nanometer where desired). Multilayer semiconductor devices with pattern features of the abovementioned dimensions, and properly aligned across multiple layers with sufficient small overlay error (≤2 nanometer) over areas with typical length or width dimensions of 1 mm to 50 mm, are not obtainable using the present conventional methods of determining overlay error. Pattern features of this size can be created, but their alignment across layers on the scale of the typical lengths or width dimensions described above cannot be achieved using conventional methods. Using the method of the present invention, the alignment of features of this size across the surface dimensions described above can be determined. Of course, the methods of the present invention may also be applied to manufacture semiconductor devices having more lenient criteria with respect to overlay errors, e.g. smaller than 5 nm.

BRIEF DESCRIPTION OF THE DRAWINGS

The invention will further be elucidated by description of some specific embodiments thereof, making reference to the attached drawings. The detailed description provides examples of possible implementations of the invention, but is not to be regarded as describing the only embodiments falling under the scope. The scope of the invention is defined in the claims, and the description is to be regarded as illustrative without being restrictive on the invention. In the drawings:

FIGS. 4A and 4B schematically illustrate a method in accordance with the present invention.

DETAILED DESCRIPTION

Figure 1:
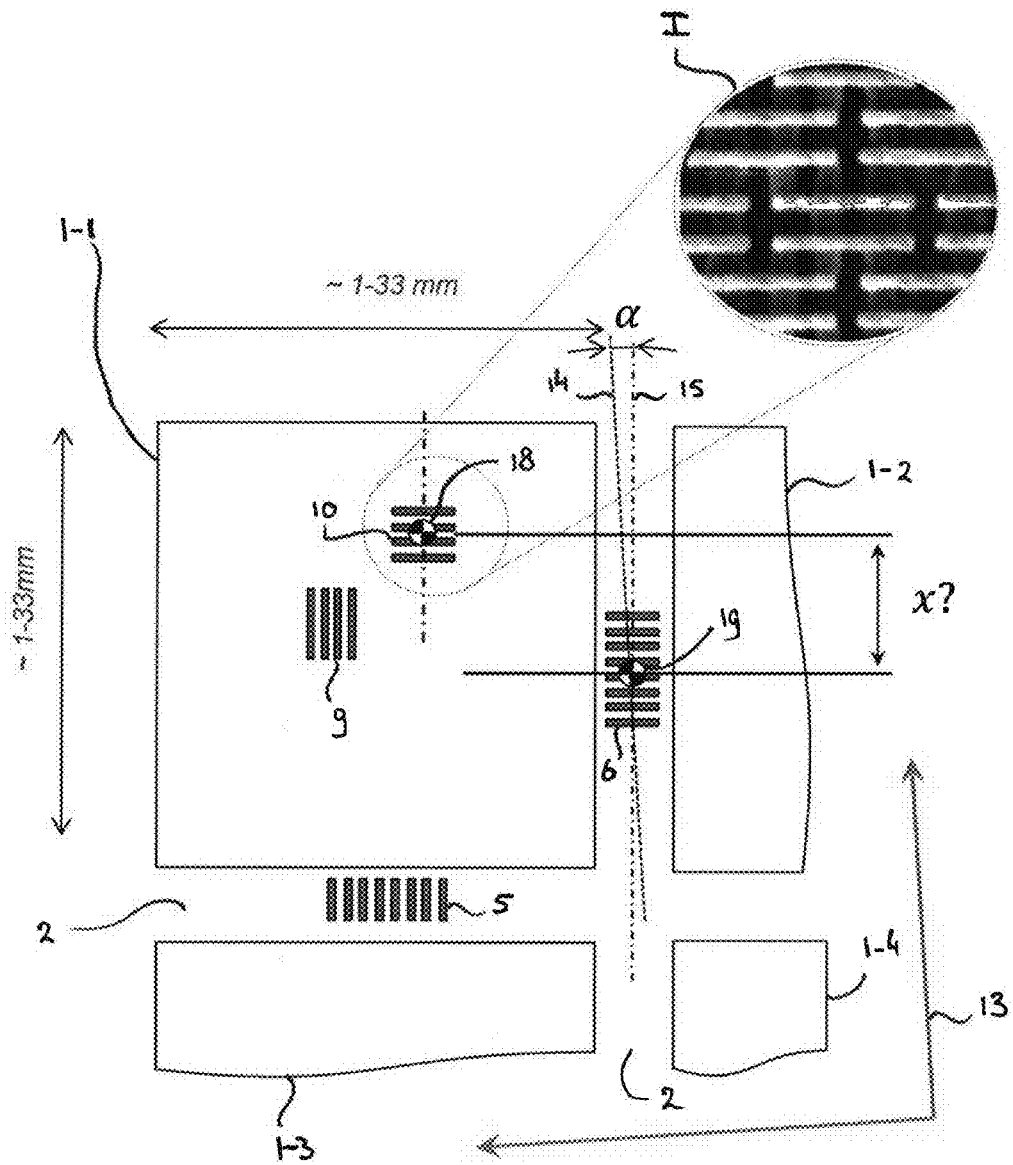
FIG. 1 schematically illustrates a situation sketch of a semi-conductor device during manufacturing in accordance with the present invention.

FIG. 1 schematically illustrates a situation sketch of a semi-conductor device 1-1 on a wafer during manufacturing in accordance with the present invention. In FIG. 1, semi-conductor device 1-1 is arranged on a wafer contiguous to a plurality of further semi-conductor devices 1-2, 1-3, 1-4. The wafer on which the devices 1-1, 1-2, 1-3 and 1-4 are arranged (not visible on the scale of focus of the situation sketch) maybe placed on a metrology frame of a system for determining an overlay error in accordance with a present invention. The metrology frame at the wafer may not be neatly aligned, such that the scribing lanes 2 that separate the respective semi-conductor devices 1-1 to 1-4 (to be used for separating the semi-conductor devices) may be not be perfectly aligned with the metrology coordinate system 13 of the metrology frame. In FIG. 1, this is illustrated by the angle a between the alignment axes 15 of the scribing lane 2 and the alignment orientation 14 of the coordinate system 13 of the metrology frame.

In principle, semi-conductor devices of any arbitrary size may be produced in this manner. In FIG. 1, a size range of 1 mm to 33 mm is indicated as an example of possible dimensions of the length and width of the device. However, where needed also devices smaller then 1 mm or longer then 33 mm may be manufactured.

In the scribing lanes 2, in between two or more of the semi-conductor devices 1-1 through 1-4 to be created, one or more marker elements 5, 6 are present that allow to detect an overlay error between the subsequent layers of the multilayer semi-conductor devices 1-1 through 1-4. In FIG. 1, as can be seen the marker element 5 is present in the horizontal scribing lane 2 and a marker element 6 is present in the vertical scribing lane 2. The number and orientation of the marker elements, and the scribing lanes or other parts of the wafer wherein these may be located will be at the choice of the skilled person.

In addition, each of the semi-conductor devices 1-1 through 1-4 comprises two or more functional layers which comprise functional product features, also called pattern features 9, 10. In FIG. 1, schematically two pattern features 9 and 10 are illustrated but in reality the complex pattern of product features may be present in each functional product layer.

Conventionally, overlay error is determined by determining the relative positions of the marker elements 5 or 6 in subsequent layers, such as to establish the offset between these marker elements. Based on this offset, the system optics and other system parameters of the layer deposition system are calibrated such as to minimize or completely remove the offset. However, with the integrated circuits to be manufactured nowadays and in the future the pattern features 9, 10 are of a much smaller size (e.g. ≤50 nanometre, or even≤20 nanometre or even≤5 nanometre) and the line pattern of the marker elements (e.g. several micrometre or even tenths of micrometre). In the situation sketch of FIG. 1 for example, in the enlargement I, there's provided a scanning electron microscopy (SEM) image of the pattern feature 10. The pattern feature 10 consists of a dense line spacing of unidirectional lines in one layer, and the SEM image shows an area of 500×500 nanometre, illustrating that the line pitch is 22 nanometre. Typically, in the situation of FIG. 1 the marker elements 5 and 6 consist of one directional lines having a line pitch of 2.5 micrometre over a total marker area of 80×50 micrometre. Thus in the situation sketch of FIG. 1, the pattern features are approximately one-hundred times smaller then the features of the marker elements. Using a conventional method of determining the overlay error, which is for example based on deflection optics, the overlay error measured may not be accurate on the size scale of the pattern features of the patterns 9 and 10. This is for example caused by lens errors and/or other disturbance factors caused in the optical sensing technique, affecting features differently on the size scale of the pattern features 9 and 10. Therefore, by applying the conventional method of measuring the overlay error, critical mistakes that may cause the semi-conductor elements to be defective or not working can not be prevented.

The present invention is directed at not only determining the overlay error between the marker elements in an conventional manner, but to additionally determine the relative positions within each layer, of the marker elements and one or more or all of the product features 9, 10. In FIG. 1 this is illustrated by the distance between the sensor 19 of the marker element and the sensor 18 of the pattern feature 10.

Preferably, during the imaging step for determining the relative positions of the product or pattern features 9, 10, these relative positions may be determined relative to three marker features (e.g. 5, 6 and a third marker feature). The marker-feature distances between the product features 9,10 and each of the markers (5, 6 and a third marker feature), can be scaled relative to the marker-marker distances between the marker features (5, 6 and a third marker feature). The marker-marker distances may subsequently be determined using an additional imaging step, e.g. using a diffraction optics based sensing technique such as SMASH. Any errors in calibration and possible errors due to thermal expansion of the wafer, thereby may be compensated later.

As can be seen in FIG. 1, the wafer is not perfectly aligned with the metrology coordinate system 13, and forms an angle a therewith. This angle between the wafer and the metrology coordinate system may result in an error in the determined position in case the product feature is not exactly aligned with the marker feature (which is the case in the majority of situations). By determining the position of an additional marker feature which is not arranged in a straight line with the other marker features, this error can be compensated for. In addition, any deviation of the angle between the metrology coordinate axes from being perfectly $\pi/2$ radians, can also be compensated in this manner. The product feature positions, in this manner, are determined correctly in relation to the marker features, which allows a direct relation between the various imaging and measurement steps performed. An additional calibration step may therefore be prevented.

Figure 2A:
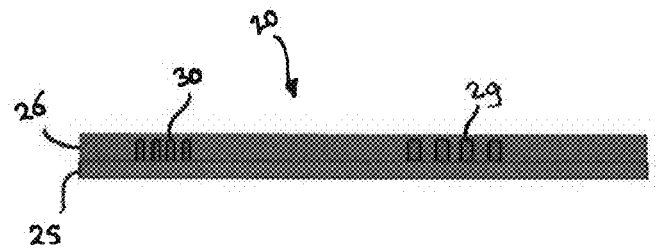
FIGS. 2A-2F schematically illustrate a method of determining an overlay error in accordance with the present invention.

FIGS. 2A through 2F schematically illustrates the various steps of a method of determining an overlay error in accordance with the present invention. In FIG. 2A, a multi-layer semi-conductor elements 20 during manufacturing thereof is illustrated consisting of substrate layer 25 and a first layer 26. The first layer 26 comprises pattern features 30 and a marker element 29.

Figure 2B:
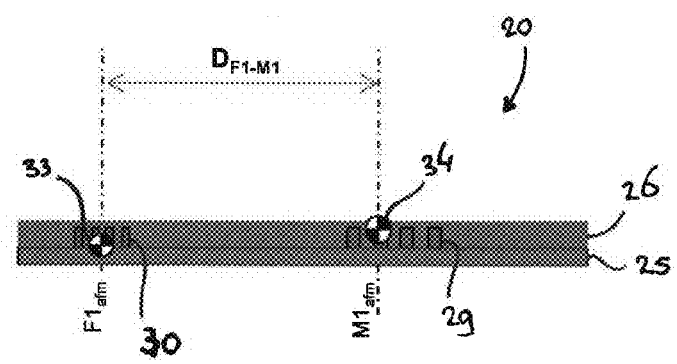
Figure 2C:
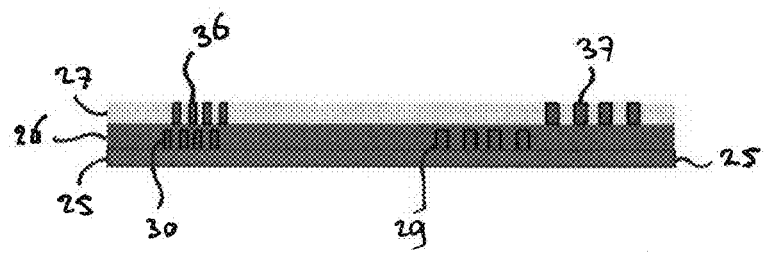

In accordance with the present invention, as illustrated in FIG. 2B, a first imaging step performed by atomic force microscopy determines distance $D_{F1-M1}$ between the relative positions of the first marker elements $M1_{AFM}$ and the pattern feature $F1_{AFM}$ measured with AFM. The determined positions are indicated by element 33 for pattern feature 30 and element 34 for marker element 29.

Figure 2D:
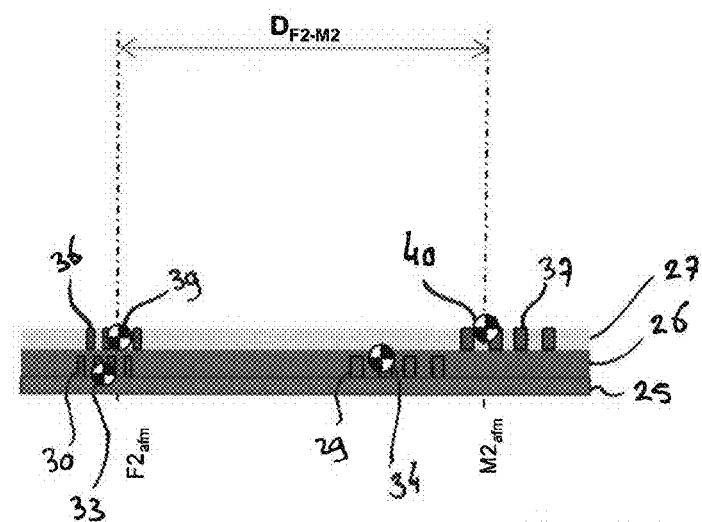

Then, in step 2C, a second layer 27 is deposited on top of the first layer 26. The second layer 27 comprises pattern feature 36 and marker element 37. In accordance with the present invention in FIG. 2B, the distance $D_{F1-M2}$ between the relative position $F2_{AFM}$ of the pattern feature 36 and the relative position of $M2_{AFM}$ of the marker element 37 is determined using an imaging step e.g. by applying AFM. The relative positions 39 and 40 of the pattern feature 36 and the marker element 37 of the second layer 27 are indicated in FIG. 2D as being determined using AFM. To perform the in-layer imaging steps illustrated in FIGS. 2B and 2D, the use of atomic force microscopy is particularly suitable, because it allows to accurately image a large area of each of the layers 26 and 27 while providing a very high resolution across the full area imaged.

Figure 2E:
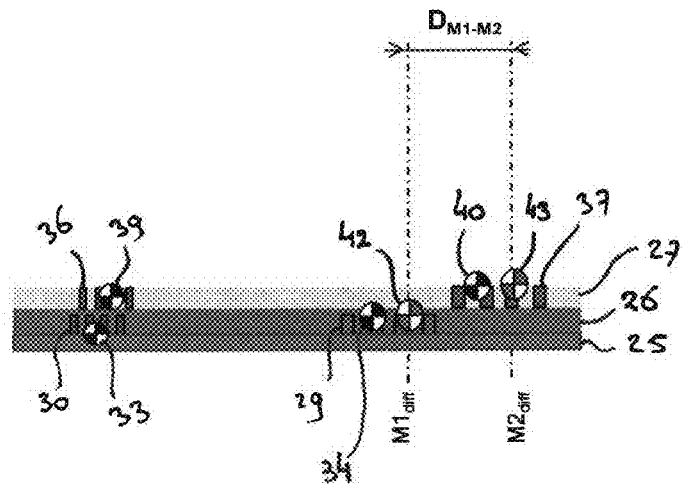

In the imaging step illustrated in FIG. 2E, the relative positions of the marker elements 29 and 37 are determined using a conventional interlayer imaging step, such as a defective optic based alignment sensing step. This additional step is needed in addition to the highly accurate in-layer AFM methods, because these latter imaging steps do not provide information on the interlayer offsets. The AFM methods primarily allow the imaging of surface features, i.e. the features of one layer, with high resolution and accuracy. The interlayer offset, e.g. $D_{M1-M2}$ between relative positions 42 and 43 of the marker elements 29 and 37 in FIG. 2E, provides these interlayer dependencies while the in-layer imaging steps provide the accuracy at pattern feature scale.

The relative positions 33 and 34 in the first layer 26 and 39 and 40 in the second layer, determined using atomic force microscopy, many times do not coincide with the relative positions found using different imaging methods. Therefore, when in accordance with the present invention also the distance $D_{M1-M2}$ has to be determined using an interlayer imaging step (e.g. conventional defective optic based alignment sensing step), the relative positions 42 and 43 of respectively the first marker element 29 in the first layer 26 and the second marker element 37 in the second layer 27 do not coincide with the relative positions 34 and 40 determined using AFM. However, it is many times not important that relative positions 42 and 43 do not coincide with the relative positions 34 and 40. In accordance with the present invention only the distance $D_{M1-M2}$ is determined for determining the overlay error between the layers 26 and 27. As an optional improvement, where this is considered desirable, the in-layer AFM method for determining the relative positions (e.g. 33 and 34 in FIG. 2B), are of a sufficient accuracy and high resolution that the imaging data obtained allows to predict where the relative positions of the marker elements (e.g. position 42 of marker element 29) as obtained using the interlayer imaging step will be located. This information may be obtained in an additional analysis step during analysis of the imaging data from the AFM.

Figure 2F:
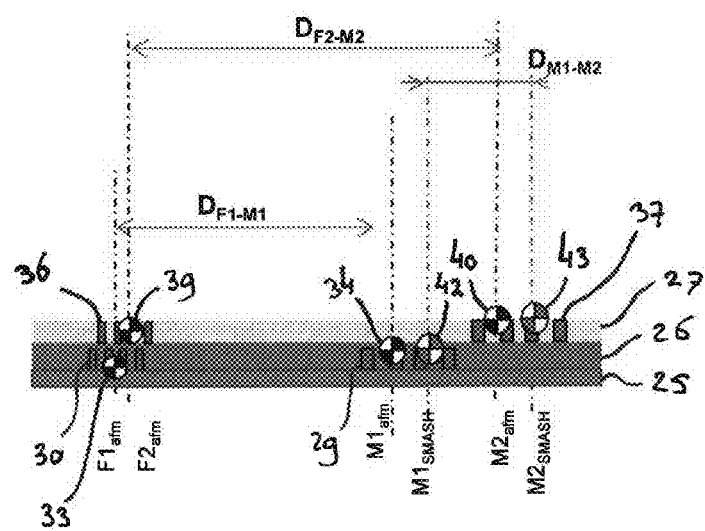

FIG. 2F in summary illustrates the distances determined in accordance with the present invention. The distance $D_{F1-M1}$ may be related to the distance $D_{F1-M2}$ via the distance $D_{M1-M2}$ which is determined using conventional imaging methods. The conventional imaging methods for performing the interlayer imaging to determine the distance between the marker elements 29 and 37 is able to perform this imaging across both layers 26 and 27 such as to directly determine the distance $D_{M1-M2}$. The additional imaging steps that are performed in layer, on respectively the first layer 26 and the second layer 27, make it possible to accurately relate the relative positions of the pattern features 30 and 36 to each other, to thereby provide the overlay error with much more accuracy then the conventional imaging techniques.

Figure 3:
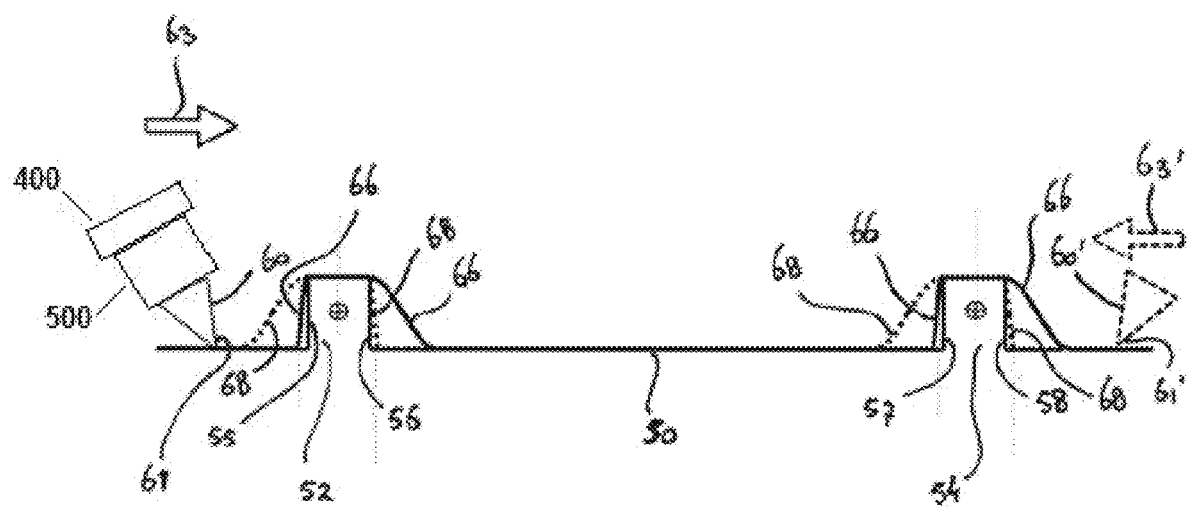
FIG. 3 schematically illustrates an atomic force microscopy method in accordance with an embodiment of the present invention used for determining an overlay error.

As maybe appreciated by the skilled person, when atomic force microscopy is used for imaging the surface of one layer, the shape of the probe tip of the probe that is used for performing the atomic force microscopy may introduce a measurement error or inaccuracy. The probe tip 60 of a probe 500 used for atomic force microscopy may be cone-shaped or triangular, or at least have a shape with slanted side walls in the direction of motion of the tip 60. This is illustrated in FIG. 3 for probe tip 60. The scanning probe microscopy can be performed using a sensor head 400 including the probe 500. In FIG. 3, probe tip 60 has been tilted in such a manner relative to the direction of motion 63 that the apex 61 of the probe tip 60 will be the foremost point in the direction of motion 63 of the probe tip 60. Therefore, by scanning the service 50 of the layer which comprises one or more high aspect ratio features 52 and 54, the exact positions of the side walls 55 and 57 of features 52 and 54 respectively may be determined accurately as a result of the tilting of the probe tip 60. The measured positions of the apex 61 of the probe tip 60 during scanning are schematically illustrated by line 66 in FIG. 3. As can be seen, near side walls 55 and 57, the path 66 of apex 61 of the probe tip 60 sharply bends upwards. As a result of the tilting, on the other side walls 56 and 58 of the high aspect ratio features 52 and 54 respectively, the apex 61 will follow a path that only gradually moves back to the service 50. This is caused by contact of the backside of the probe tip 60 with the high aspect features 52 and 54. Therefore, to accurately measure the shape of the high aspect features 52 and 54 in both directions, the tilting of the probe tip 60 will be adapted dependent on the scanning direction 63 of the probe tip 60 relative to the service 50. This is illustrated in FIG. 3 by probe tip 60' moving in the direction 63'. Apex 61' of probe tip 60' follows the path 68 (dotted line). The path asses 68 shows a sharp bend upward upon encountering the side walls 58 and 56 respectively. As a result, the exact location the pattern features 52 and 54 can be determined using the tilting of the probe tip 60 dependent on the scanning direction 63.

Figure 4A:
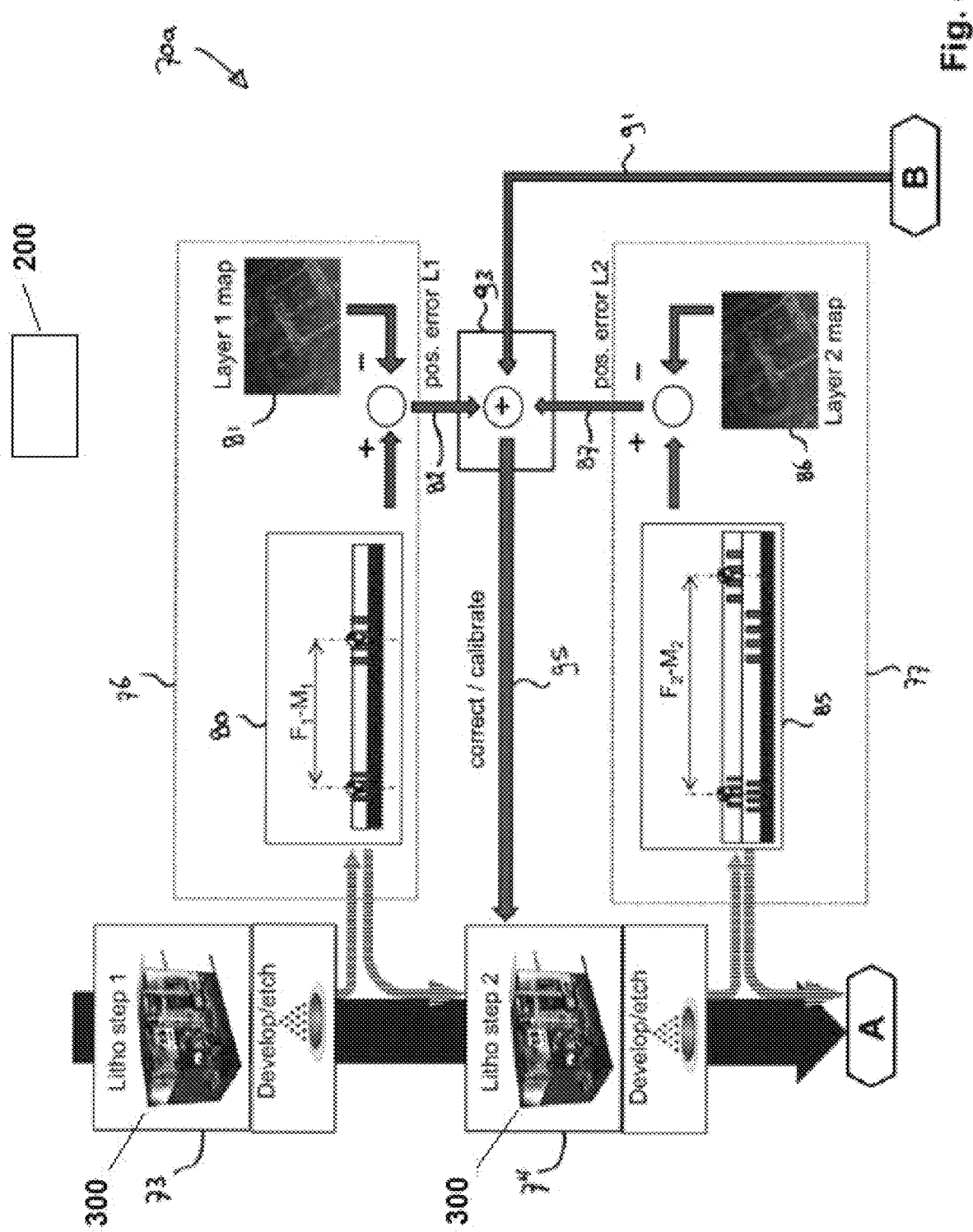

The manufacturing method of the present invention is schematically illustrated in FIG. 4A and 4B. In step 73, a first layer is deposited on top of a substrate surface by performing lithography and development or edging of the layer. Following a standard manufacturing method, a next layer will be deposited in step 74, again consisting of lithography and development or etching or any other layer deposition or forming method. This can be followed (via A) with additional depositing steps 75 until the multi-layer semi-conductor device on the wafer is formed and can be separated from the wafer.

To maintain the manufacturing system correctly calibrated, periodically the overlay error has to be determined. When determining of the overlay error is desired, manufacturing method follows a slightly difference process. As illustrated in FIG. 4A, in that case after step 73, when the first layer is formed, the method continues in step 76 wherein the relative positions between the pattern feature 30 and the marker element 29 is determined. An atomic force microscopy imaging step 80 may be performed on the first layer 26 to map the first layer 26 created in step 73. This mapping provided in step 80 may be compared with a reference map 81 stored in the memory of the system. This may for example be a blueprint or design of the pattern features to be created in layer 26. The comparison in step 76 provides a positioning error for the first layer which is stored 82 for later use.

The manufacturing method then continues with step 74 wherein the second layer 27 is deposited on the top of the first layer 26. After step 74, a further in layering imaging step 77 for determining a positioning error for the second layer. This is performed again by performing an atomic force microscopy step 85 on the second layer for determining the relative positions between the pattern features 36 and the marker element 37. After comparing the mapping of the second layer 27 with a reference map 86, the determined positioning error for the second layer will be stored 87 for later use. Via A, the method continues as illustrated in FIG. 4B with an interlayer imaging step 79 for determining the relative positions of the marker elements 29 and 37 of the first layer 26 and second layer 27 respectively. This is performed in step 90, which yield the interlayer error between the first layer and second layer. The interlayer error is stored 91 for analysis during the manufacturing method. The method then continues (via B) as illustrated again in FIG. 4A with a step 93, wherein the overlay error is determined using the determined positioning error 82, the determined positioning error 87 and the interlayer error 91. This yields calibration information 95 which is used to calibrate the manufacturing system. After the calibration step, the manufacturing system may proceed in normal mode without determining the overlay error.

An imaging device 300, such as a scanning probe microscopy device 300 may be employed for performing an imaging step on at least one of said first and second patterned layer, for determining relative positions of the respective first or second marker element and a pattern feature of a device pattern comprised by said respective first and second patterned layer.

As will be appreciated, if desired it is possible to perform a measurement and calibration of the overlay error for each wafer, which may be desired for highly critical applications. Usually, it may be sufficient to perform determination of the overlay error periodically during the process, e.g. once every ten wafers or with different periodicity. The various deposition steps and lithography steps or development steps may be performed using a single system or alternatively some layers or each layer may be performed using different systems or apparatuses. In those cases where a plurality of systems or apparatuses are applied, the in-layer imaging steps performed using atomic force microscopy may, in addition to determining the overall overlay error between the different layers, be used for calibrating the and other parameters of each or some of the systems and apparatuses applied.

The present invention has been described in terms of some specific embodiments thereof. It will be appreciated that the embodiments shown in the drawings and described herein are intended for illustrated purposes only and are not by any manner or means intended to be restrictive on the invention. It is believed that the operation and construction of the present invention will be apparent from the foregoing description and drawings appended thereto. It will be clear to the skilled person that the invention is not limited to any embodiment herein described and that modifications are possible which should be considered within the scope of the appended claims. Also kinematic inversions are considered inherently disclosed and to be within the scope of the invention. In the claims, any reference signs shall not be construed as limiting the claim. The term 'comprising' and 'including' when used in this description or the appended claims should not be construed in an exclusive or exhaustive sense but rather in an inclusive sense. Thus the expression 'comprising' as used herein does not exclude the presence of other elements or steps in addition to those listed in any claim. Furthermore, the words 'a' and 'an' shall not be construed as limited to 'only one', but instead are used to mean 'at least one', and do not exclude a plurality. Features that are not specifically or explicitly described or claimed may be additionally included in the structure of the invention within its scope. Expressions such as: "means for . . . " should be read as: "component configured for . . . " or "member constructed to . . . " and should be construed to include equivalents for the structures disclosed. The use of expressions like: "critical", "preferred", "especially preferred" etc. is not intended to limit the invention. Additions, deletions, and modifications within the purview of the skilled person may generally be made without departing from the spirit and scope of the invention, as is determined by the claims. The invention may be practiced otherwise then as specifically described herein, and is only limited by the appended claims.

The invention claimed is:

1. A method of determining an overlay error during manufacturing of a multilayer semiconductor device, wherein said manufacturing of the semiconductor device comprises the steps of:
forming a stack of material layers comprising depositing of at least two subsequent patterned layers of semiconductor material, the patterned layers comprising a first patterned layer having a first marker element and a second patterned layer having a second marker element; and wherein the determining of the overlay error comprises:
determining relative positions of the first and second marker elements in relation to each other such as to determine the overlay error between the first patterned layer and the second patterned layer;
wherein for determining the overlay error, in addition to said step of determining said relative positions of the first and second marker element, the method comprises a step of:
determining, by performing an imaging step on at least one of said first and second patterned layers, relative positions of the respective first or second marker element and a pattern feature of a device pattern comprised by said respective first and second patterned layers, the pattern feature being a functional feature of the multilayer semiconductor device.

2. The method according to claim 1, wherein the imaging step is performed on both the first patterned layer and the second patterned layer.

3. The method according to claim 1, wherein the step of determining the relative positions of the first and second marker element in relation to each other comprises an optical diffraction sensing step suitable for detecting both the first marker element in the first patterned layer and the second marker element in the second patterned layer.

4. The method according to claim 1, wherein the imaging step is performed using atomic force microscopy.

5. The method according to claim 1, further comprising a step of obtaining a reference map of the at least one of said first and second patterned layer to be imaged during the imaging step, and comparing an image of the respective one of the at least one of said first and second patterned layer obtained by means of said imaging step with said reference map for determining a positioning error.

6. The method according to claim 5, further comprising a step of determining, based on the position error, manufacturing adjustments for adjusting said depositing of a respective first or second patterned layer of the at least two subsequent patterned layers of semiconductor material for correcting the position error.

7. The method according to claim 1, wherein the imaging step is performed using scanning probe microscopy.

8. The method according to claim 7, wherein said scanning probe microscopy is performed using a sensor head including a probe with a cone shaped probe tip for scanning of a surface of the at least one first or second patterned layer, and wherein the sensor head is arranged for tilting of the cone shaped probe tip such that an apex of the cone shaped probe tip forms a foremost point in a scanning direction during said scanning.

9. The method according to claim 8, wherein said scanning is performed by moving the probe relative to the surface of the at least one first or second patterned layer in a first scanning direction, and subsequently moving the probe relative to the surface of the at least one first or second patterned layer in a second scanning direction, wherein said tilting of the cone shaped probe tip is adapted dependent on the scanning direction.

10. A manufacturing process for manufacturing a semiconductor device, the manufacturing process comprising the steps of forming a stack of material layers by depositing of at least two subsequent patterned layers of semiconductor material, the patterned layers comprising a first patterned layer having a first marker element and a second patterned layer having a second marker element, wherein the manufacturing process further comprises a method of determining an overlay error in accordance with claim 1, at least comprising the steps of :
determining relative positions of the first and second marker element in relation to each other such as to determine the overlay error between the first patterned layer and the second patterned layer;

wherein for determining the overlay error, in addition to said step of determining said relative positions of the first and second marker element, the method comprises a step of:

determining, by performing an imaging step on at least one of said first and second patterned layers, relative positions of the respective first or second marker element and a pattern feature of a device pattern comprised by said respective first and second patterned layers, wherein the pattern feature is a functional feature of the multilayer semiconductor device.

11. A manufacturing process according to claim 10, further comprising the steps of adjusting said deposition of the respective first or second patterned layer of the at least two subsequent patterned layers for correcting the overlay error.

12. A system for manufacturing of a multilayer semiconductor device, the system comprising one or more layer deposition arrangements for forming a stack of material layers by depositing of at least two subsequent patterned layers of semiconductor material, the patterned layers comprising a first patterned layer having a first marker element and a second patterned layer having a second marker element, wherein the system further comprises:
a sensor arrangement for determining relative positions of the first and second marker element in relation to each other;
a processor for determining the overlay error between the first patterned layer and the second patterned layer based on the determined relative positions of the first and second marker element; and
an imaging device for performing an imaging step on at least one of said first and second patterned layer, for determining relative positions of the respective first or second marker element and a pattern feature of a device pattern comprised by said respective first and second patterned layers, wherein the pattern feature is a functional feature of the multilayer semiconductor device.

13. The system according to claim 12, wherein the sensor arrangement comprises an optical diffraction sensor.

14. The system according to claim 12, wherein the imaging device is an atomic force microscopy device.

15. The system according to claim 12, wherein the imaging device is a scanning probe microscopy device.

16. The system according to claim 15, comprising a sensor head including a probe with a cone shaped probe tip for scanning of a surface of the at least one first or second patterned layer for performing said scanning probe microscopy, wherein the sensor head is arranged for tilting of the cone shaped probe tip such that an apex of the cone shaped probe tip forms a foremost point in a scanning direction during scanning.

* * * * *